(12) United States Patent  
Schmidtke et al.

(10) Patent No.: US 7,061,767 B2
(45) Date of Patent: Jun. 13, 2006

(54) DATA SYSTEMS, APPARATUSES AND/OR METHODS

(75) Inventors: Gregg S. Schmidtke, Fort Collins, CO (US); Kelly J. Reasoner, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 195 days.

(21) Appl. No.: 10/776,704

(22) Filed: Feb. 10, 2004

(65) Prior Publication Data

US 2005/0174742 A1 Aug. 11, 2005

(51) Int. Cl.
*G06F 1/16* (2006.01)
(52) U.S. Cl. .................... 361/724; 312/223.1
(58) Field of Classification Search ........ 361/724–727; 312/223.1, 223.2, 223.3
See application file for complete search history.

(56) References Cited

U.S. PATENT DOCUMENTS

| 5,420,750 | A  | * | 5/1995  | Freige et al. ............... 361/726 |
| 5,816,673 | A  | * | 10/1998 | Sauer et al. ............. 312/223.2 |
| 5,877,938 | A  | * | 3/1999  | Hobbs et al. ............... 361/724 |
| 6,055,152 | A  | * | 4/2000  | Felcman et al. ............ 361/725 |
| 6,134,115 | A  | * | 10/2000 | Sim et al. ................... 361/747 |
| 6,178,086 | B1 | * | 1/2001  | Sim et al. ................ 312/223.2 |
| 6,181,552 | B1 | * | 1/2001  | Neville et al. ............. 361/724 |
| 6,238,026 | B1 |   | 5/2001  | Adams et al. |
| 6,483,710 | B1 | * | 11/2002 | Reasoner et al. ........... 361/726 |

* cited by examiner

*Primary Examiner*—Lisa Lea-Edmonds (57) ABSTRACT

Apparatuses, systems and/or methods including a data apparatus and/or system having: an open-backed housing with a front wall, and first and second side walls; and an open-backed portion defined between the first and second side walls; whereby the open-backed portion is disposed to interchangeably receive any of a plurality of discrete, similarly-sized modules therein.

26 Claims, 11 Drawing Sheets

DATA SYSTEMS, APPARATUSES AND/OR METHODS

BACKGROUND

Data storage and retrieval systems exist in many types and styles. There are, in fact, many such systems which are particularly useful for handling and storing data cartridges, such as optical disk or magnetic tape cartridges. Often these systems are used to store data cartridges in particular assigned or changeably selected and recorded locations or positions within the overall system, and to also retrieve desired cartridges on demand so that data may be written to or read therefrom. Some of these data storage and handling systems are often referred to as "juke box" data storage systems, particularly if they include robotics or other types of pick and place mechanisms or a rotisserie or rotating magazine or other sort of automated motion system for moving the cartridges from one location to another for loading any one or more cartridges for storage or use. These systems can each thus accommodate a large number of individual data cartridges.

A typical juke box data storage system may include one or more different types of cartridge related devices for receiving one or more of the various data cartridges. For example, one or more cartridge receiving storage racks or magazines are typical. Also often included is a cartridge read/write device such as a tape or disk drive which may read data from or write or record data to the media in/on the data cartridge. The cartridge storage racks or magazines may provide respective rows of storage locations for the data cartridges and are commonly arranged so that they form one or more horizontal rows. One or more cartridge read/write devices may then be located adjacent the cartridge rows. These types of storage racks (hereafter referred to as magazines) and the read/write devices are adapted to receive the data cartridges for storage or use and may thus be referred to generally as cartridge receiving devices. The data storage system may also be provided with a cartridge access device such as a robotic picker or other pick and place device for accessing one or more of the various data cartridges contained in the cartridge receiving devices and a positioning device for moving the cartridge access device among the cartridge rows, and/or into position adjacent the read/write device.

These cartridge-type data storage systems may be disposed in various alternative arrangements. Single plane systems are available as substantially self-contained units capable of residing on a table-top, or other like location. Such single plane table-top systems may then in some alternative embodiments be adapted to be modified to be dual horizontal plane systems (or even triple plane, quadruple plane or any other reasonable number of planes) by stacking one or more such units upon each other as described generally above. Such systems may then be cooperatively connected together in such a stack or stacks and may be adapted to be structurally secured each to another one or more such systems. It is noted that such modifications may be consumer or factory made and may be temporary or permanent, i.e., special permanent housings for dual, triple, etc. units may be pre-fabricated to create secure, permanent multi-plane systems.

As an alternative, upright cabinets containing one or more shelves, brackets or racks for supporting one or more single (or dual or triple, etc.) plane systems may be provided to create what may be referred to as a rack mount system. In such a system, the otherwise separately definable units or systems may then be "stacked" vertically one above another, but supported in such an arrangement by the rack frame defined in and/or supported by the cabinet. Pass-through robotics or other, pick and place mechanisms may then operate here as well, without however, the relative planar units having to be secured one to another.

SUMMARY

Herein disclosed are structures, systems and/or methods which may include a data apparatus comprising: an open-backed housing having a front wall, and first and second side walls; and an open-backed portion defined between the first and second side walls; whereby the open-backed portion is disposed to interchangeably receive any of a plurality of discrete, similarly-sized modules therein.

DETAILED DESCRIPTION

Disclosed herein are modular apparatuses, systems and/or methods directed generally to provision of a housing and one or more interchangeable components or modules adapted to be used therewith. The interchangeable components or modules are insertable in and/or removable from the housing. For further detail, reference will now be made to the following description together with the attached illustrations in the drawings with like numerals indicating like parts throughout the several views.

Figure 1:
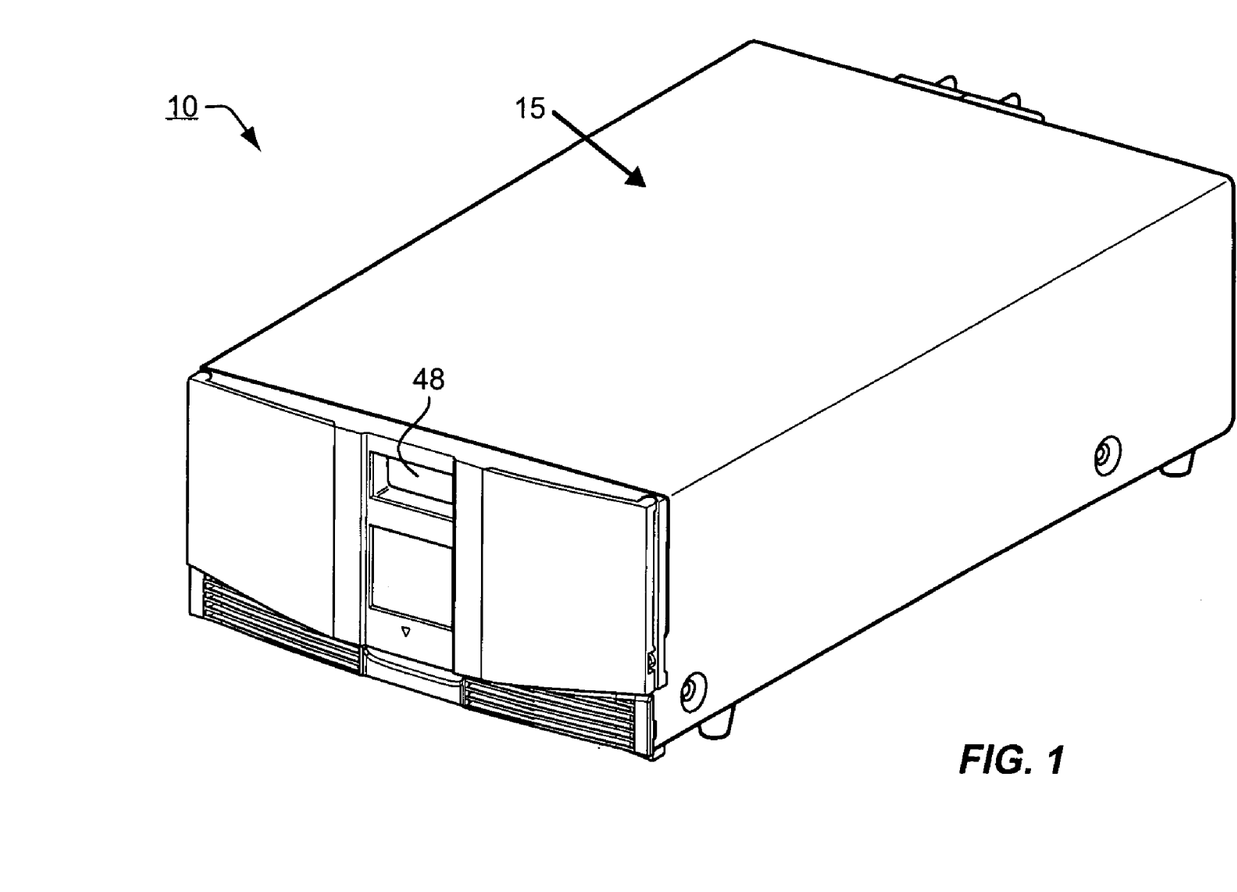
FIG. 1 is an isometric view of a single plane data apparatus.

Exemplary embodiments of the present invention may be useful in various manifestations including that of a data system 10, which according to a first such exemplary embodiment as is shown in FIG. 1, may include an apparatus 15. Apparatus 15 may be, as shown, a substantially single planar, horizontally-disposed apparatus, and may be adapted for data storage and/or retrieval. A single planar or single plane apparatus 15 is, in contrast to a multiple or multi-planar apparatus 55 (see below), one in which data storage cartridges are stored, retrieved and otherwise handled (e.g., written to or read from) substantially on a single plane. Such an apparatus 15 may be a substantially self-contained table-top device or may alternatively be adapted to be disposed in a stack or rack mount data system 50 such as that shown in FIG. 2. Such an apparatus 15 might be disposed on or otherwise connected to one or more rails 52 or the like which are in turn connected to one or more frame members 53, 54 or the like within an overall system 50 as shown for example in FIG. 3.

Figure 2:
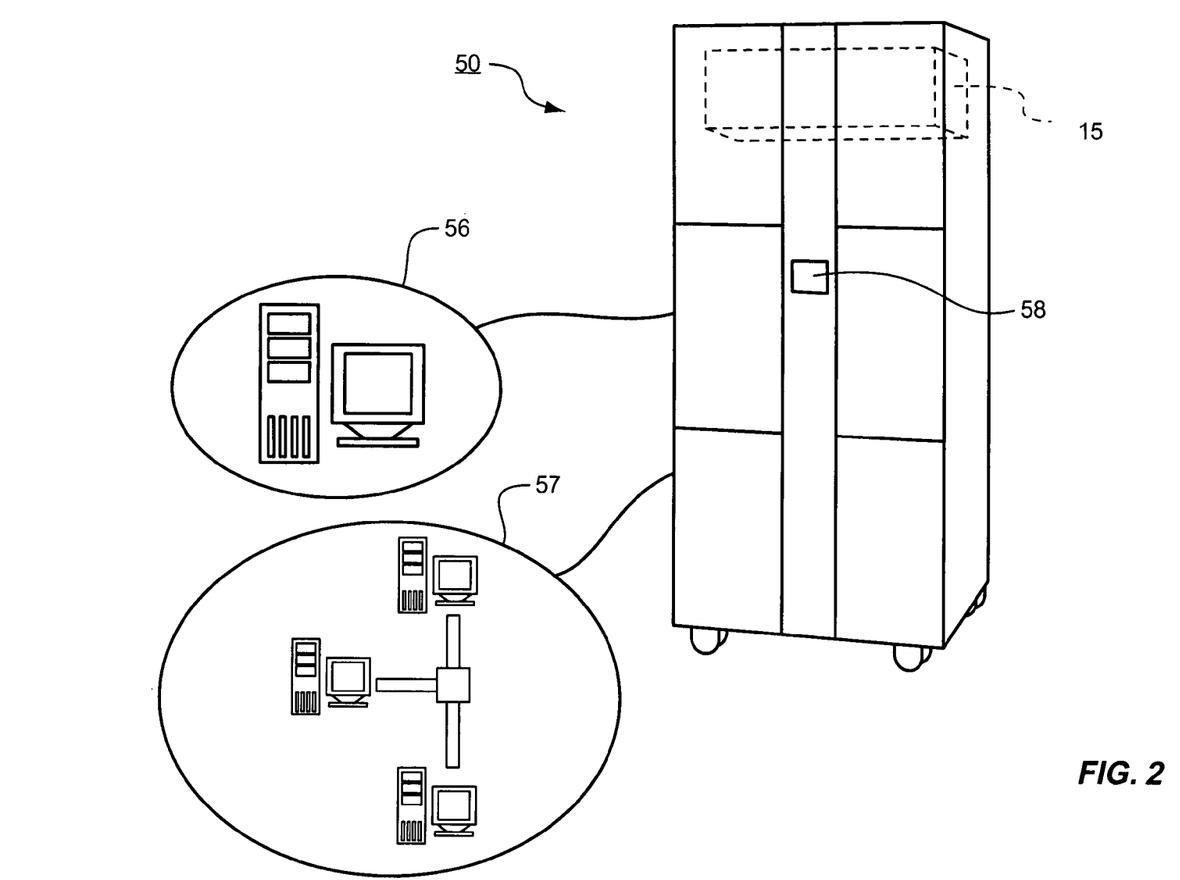
FIG. 2 is a front perspective view of a rack mount and/or multiple stack data apparatus.
Figure 3:
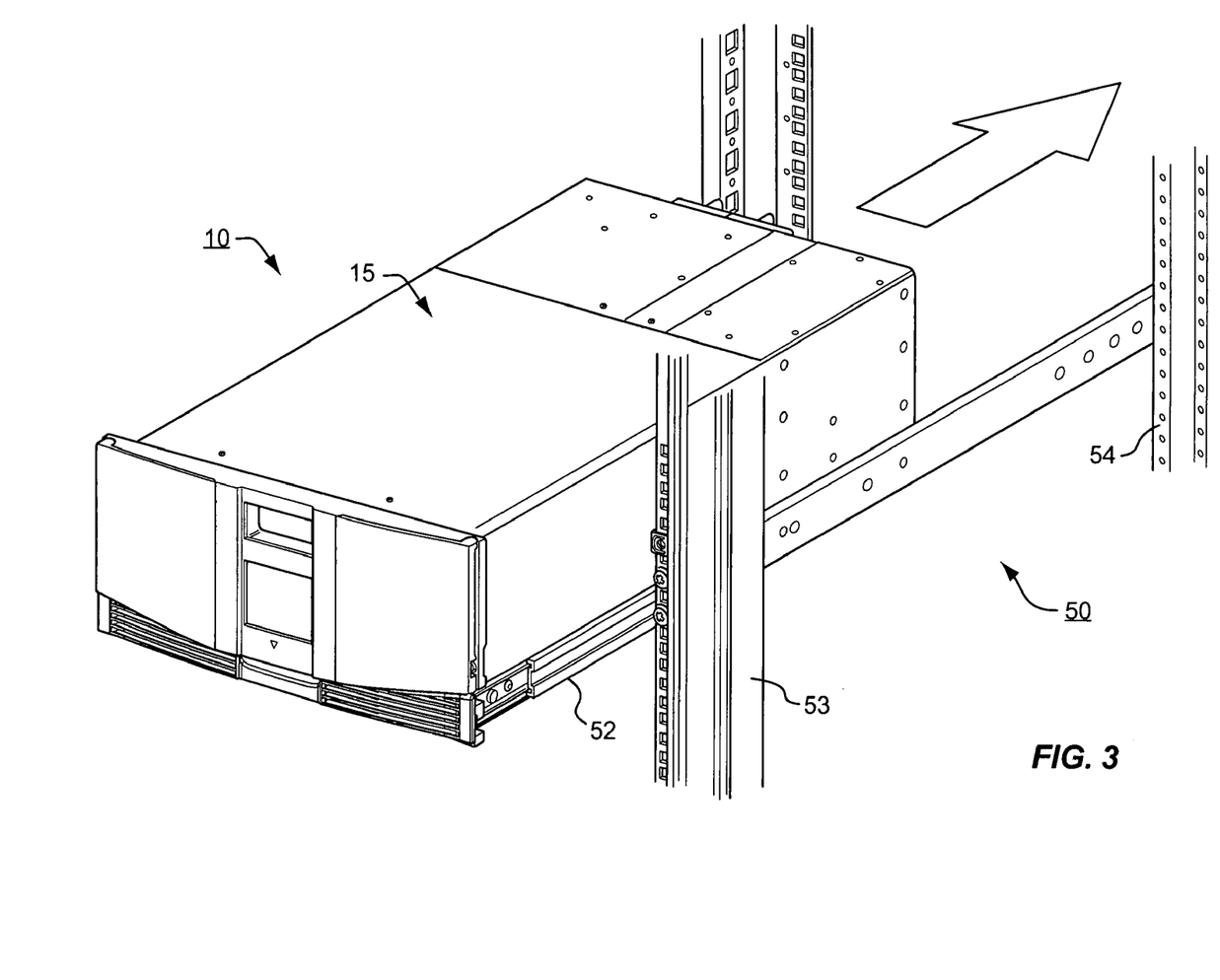
FIG. 3 is an isometric, partially cut-away view of a single plane data apparatus as in FIG. 1 being mounted in a rack mount data apparatus like that in FIG. 2.
Figure 4:
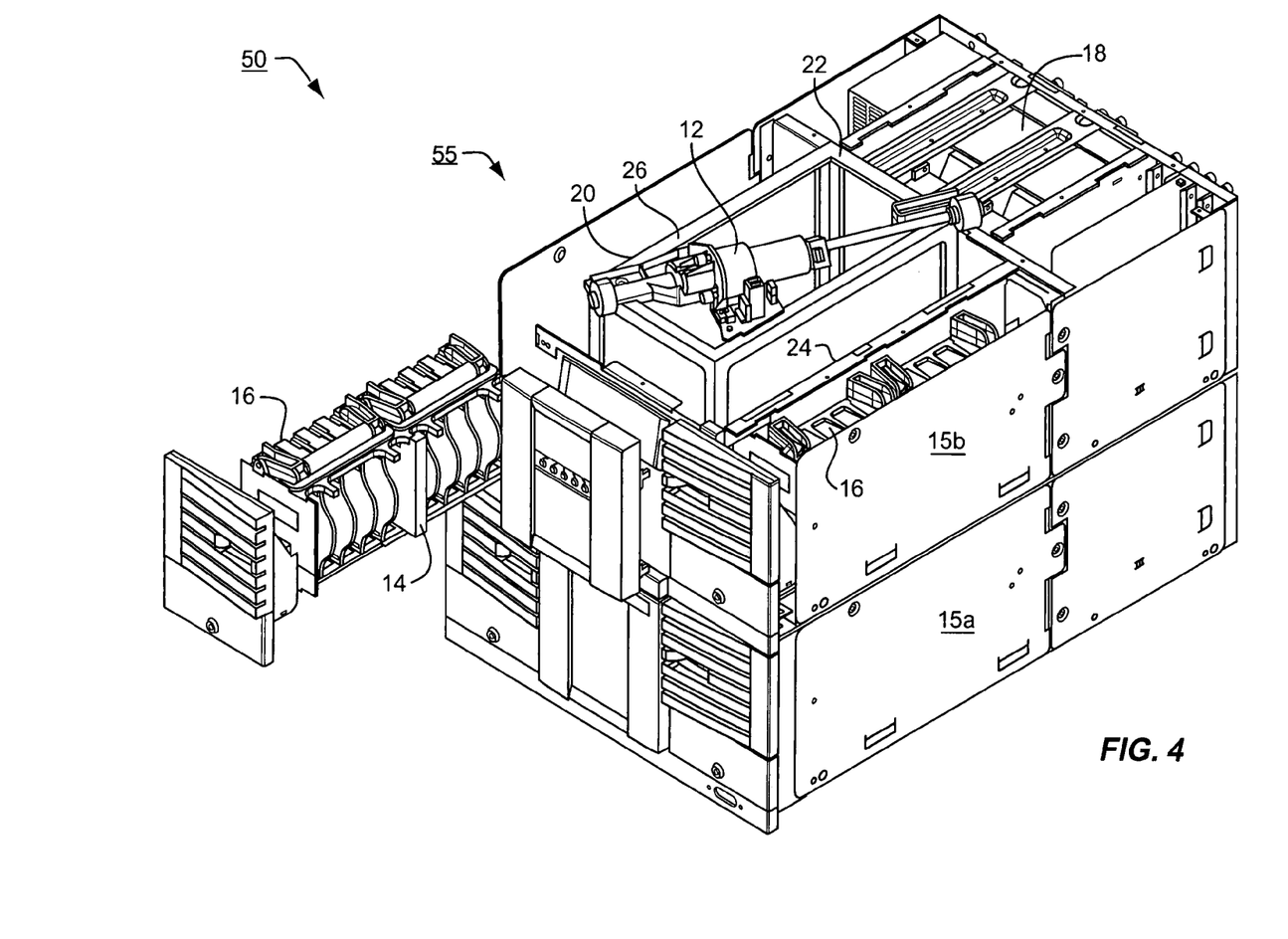
FIG. 4 is an isometric, partially exploded view of a multiply stacked data apparatus including two single plane apparatuses like that in FIG. 1.
Figure 5:
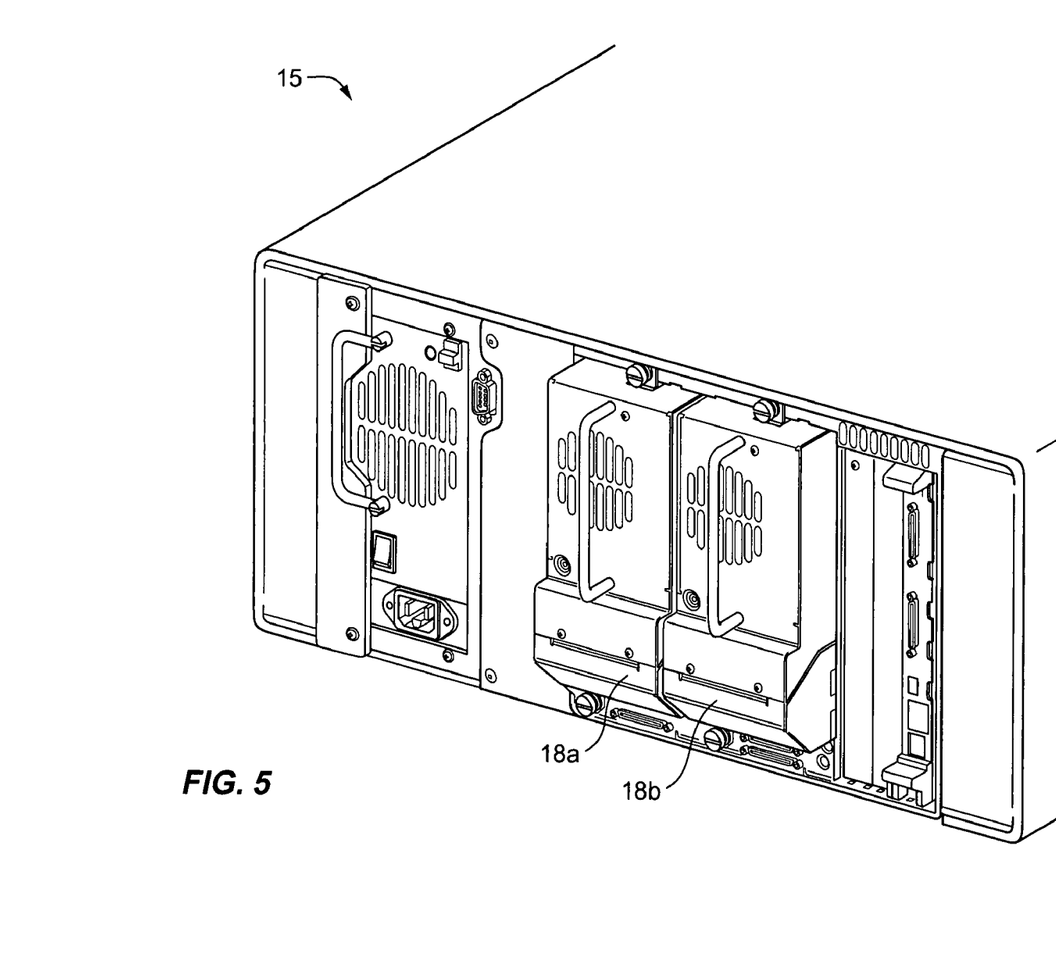
FIG. 5 is a rear isometric, partially cut-away view of a single plane apparatus like those in FIGS. 1 3, and 4.

Alternatively, two or more such apparatuses 15 may be stacked together to create a stack 55, also known and referred to as a multiple plane or multi-planar apparatus 55, as shown in the detailed exemplary embodiment of FIG. 4, where a bottom apparatus 15a has a top apparatus 15b stacked thereupon. The stack embodiment 55 in FIG. 4 also shows in more detail some alternative features such as a cartridge handling system 12 for transferring data cartridges 14 (only one shown in FIG. 4) between one or more cartridge receiving devices, such as one or more cartridge storage racks or magazines 16 and one or more cartridge read/write devices 18 (a rear view of the two separate drive units 18a and 18b are shown inserted in an apparatus 15 in FIG. 5). In a multi-plane system 50, which may include one or more apparatuses 15 as shown in FIGS. 1–3, or one or more multi-plane apparatuses 55 such as is shown in FIG. 4, a vertical lift assembly may be a part of the cartridge handling system 12, and as such may be a pre-existent part thereof, or a part adapted to be added to the overall multi-plane system upon the creation thereof by the stacking of two or more priorly separate single plane apparatuses 15. The various cartridge receiving devices (e.g., the cartridge storage racks or magazines 16 and the cartridge read/write devices 18) may be positioned at various locations around the cartridge handling system 12 so that they define the generally U-shaped configuration shown in FIGS. 6 and 7 (and see FIGS. 8–11 described further below).

Figure 6:
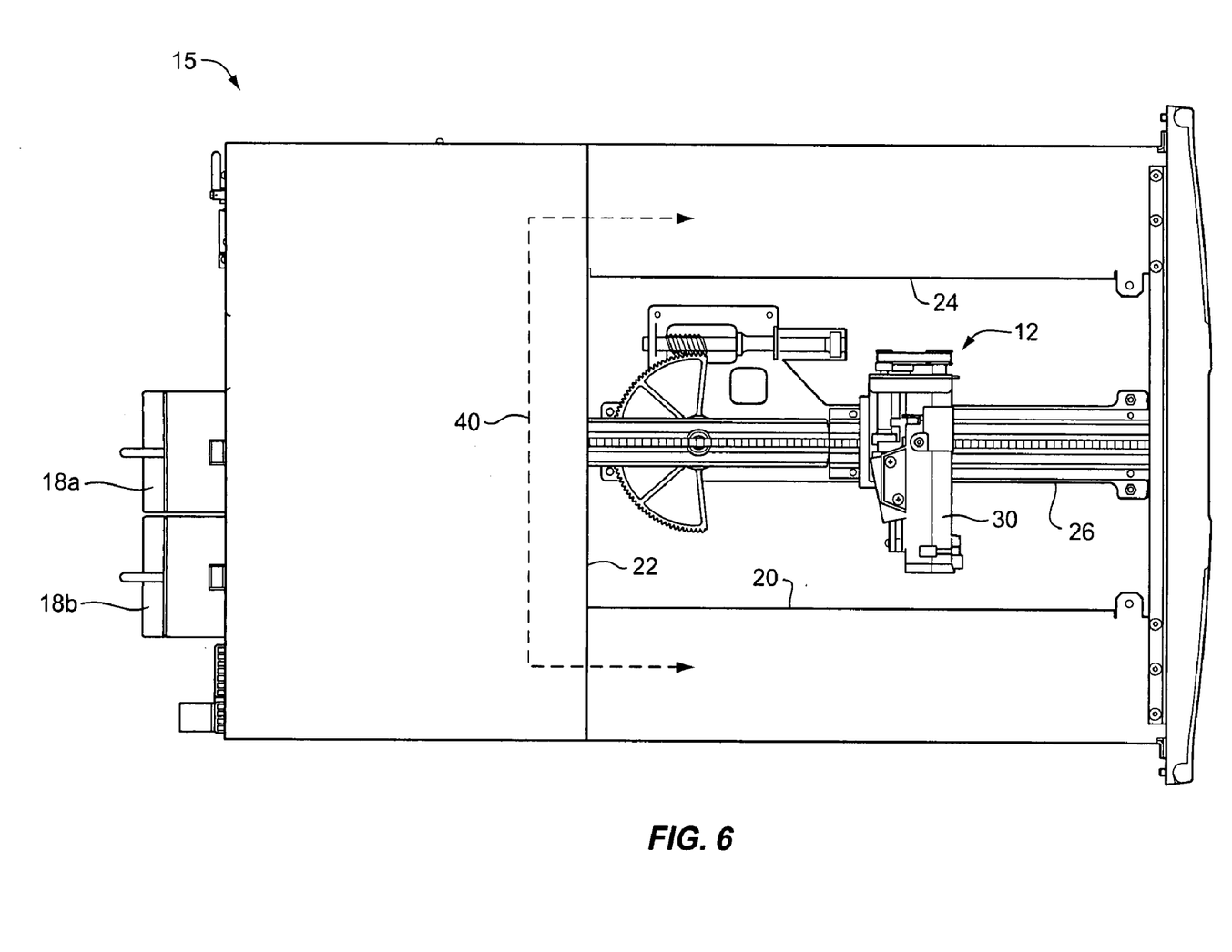
FIG. 6 is a plan view of a single (or plural) plane apparatus showing an alternative cartridge access system.
Figure 7:
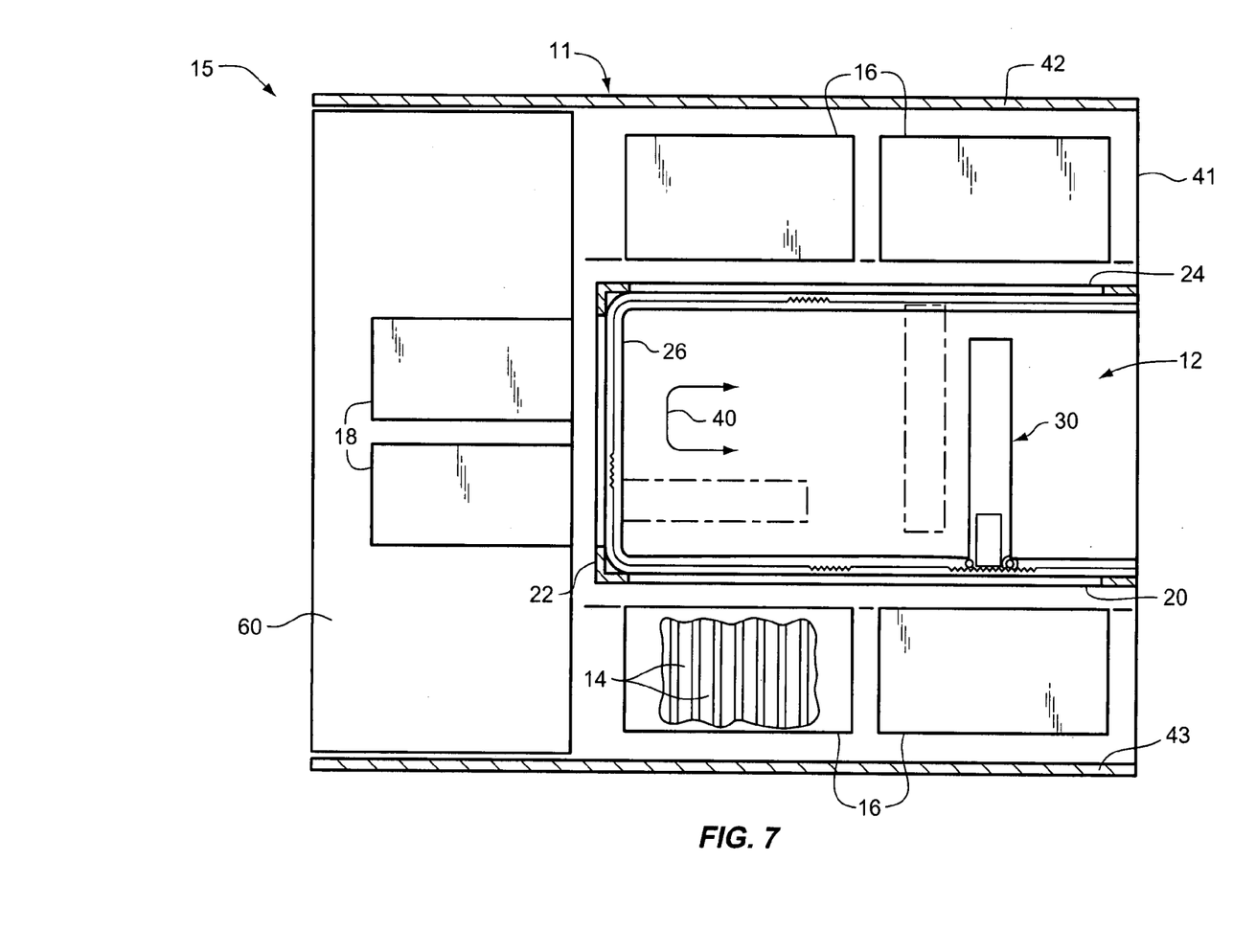
FIG. 7 is a plan view of an alternative single (or plural) plane apparatus showing a further alternative cartridge access system.

Various embodiments of a cartridge handling system 12 are shown in FIGS. 4 and 6 each of which generally includes a frame assembly 26 on which may be supported a mechanical gripper or "picker" 30 of a robotic or other pick and place mechanism. The frame assembly 26 as well as or in cooperative relationship with the open cartridge receiving and delivery sides of the cartridge receiving devices (magazines 16 and/or drive(s) 18) may define a first cartridge access side 20, a second cartridge access side 22, and a third cartridge access side 24 all laying in a horizontal disposition relative to each other. The first and third cartridge access sides 20 and 24 may be positioned in generally spaced-apart relation, whereas the second cartridge access side 22 may be oriented generally transverse to the first and third cartridge access sides 20 and 24. The various cartridge receiving devices may thus be positioned around the cartridge handling system 12 so that the cartridge receiving devices and the three defined cartridge access sides 20, 22, and 24 thereby define a substantial horseshoe or U-shape 40 as depicted by the arrows 40 in FIGS. 6 and 7.

Figure 8:
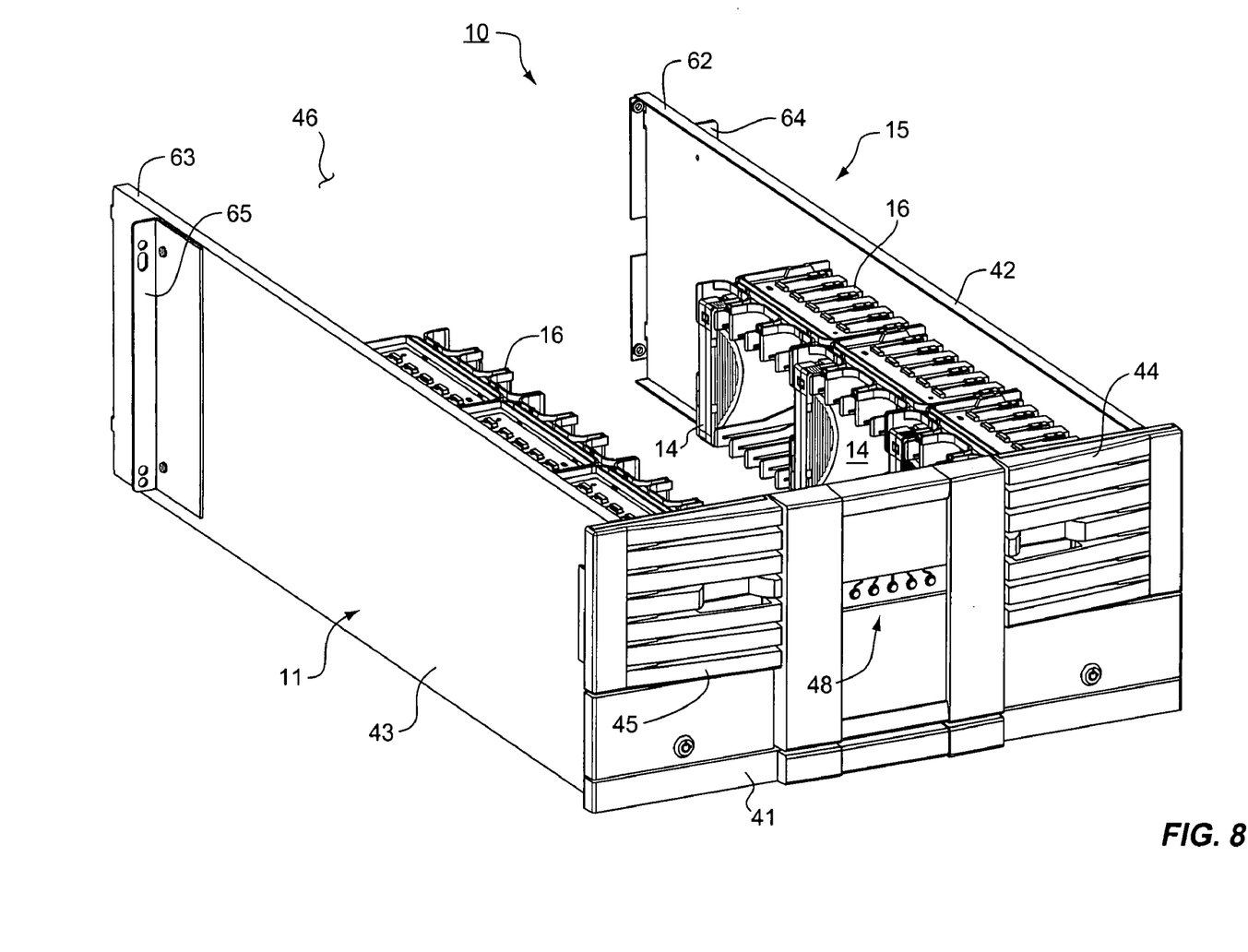
FIG. 8 is an isometric view of an alternative single plane apparatus according to an exemplary embodiment of the present invention.
Figure 9:
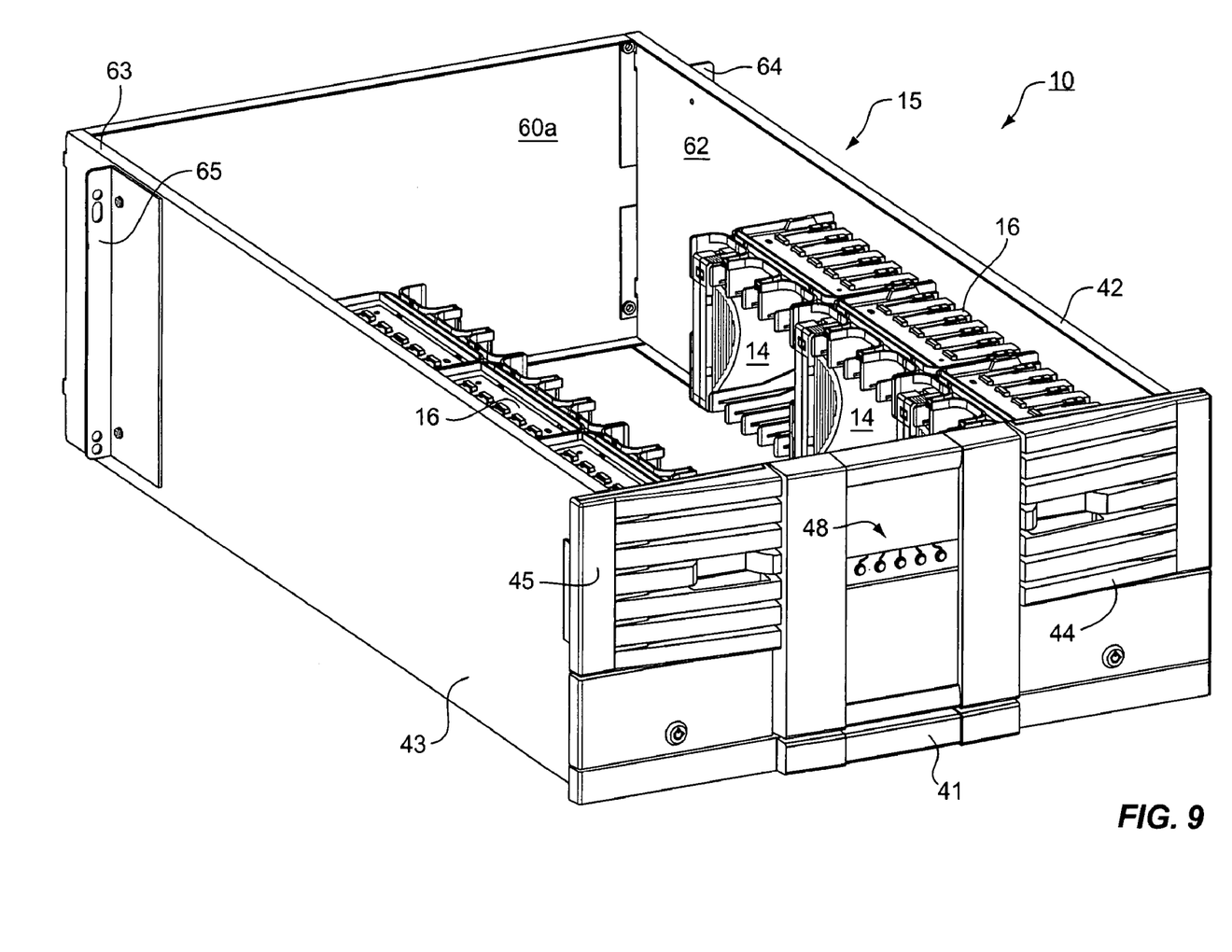
FIG. 9 is an isometric view of an alternative single plane apparatus like that in FIG. 8.
Figure 10:
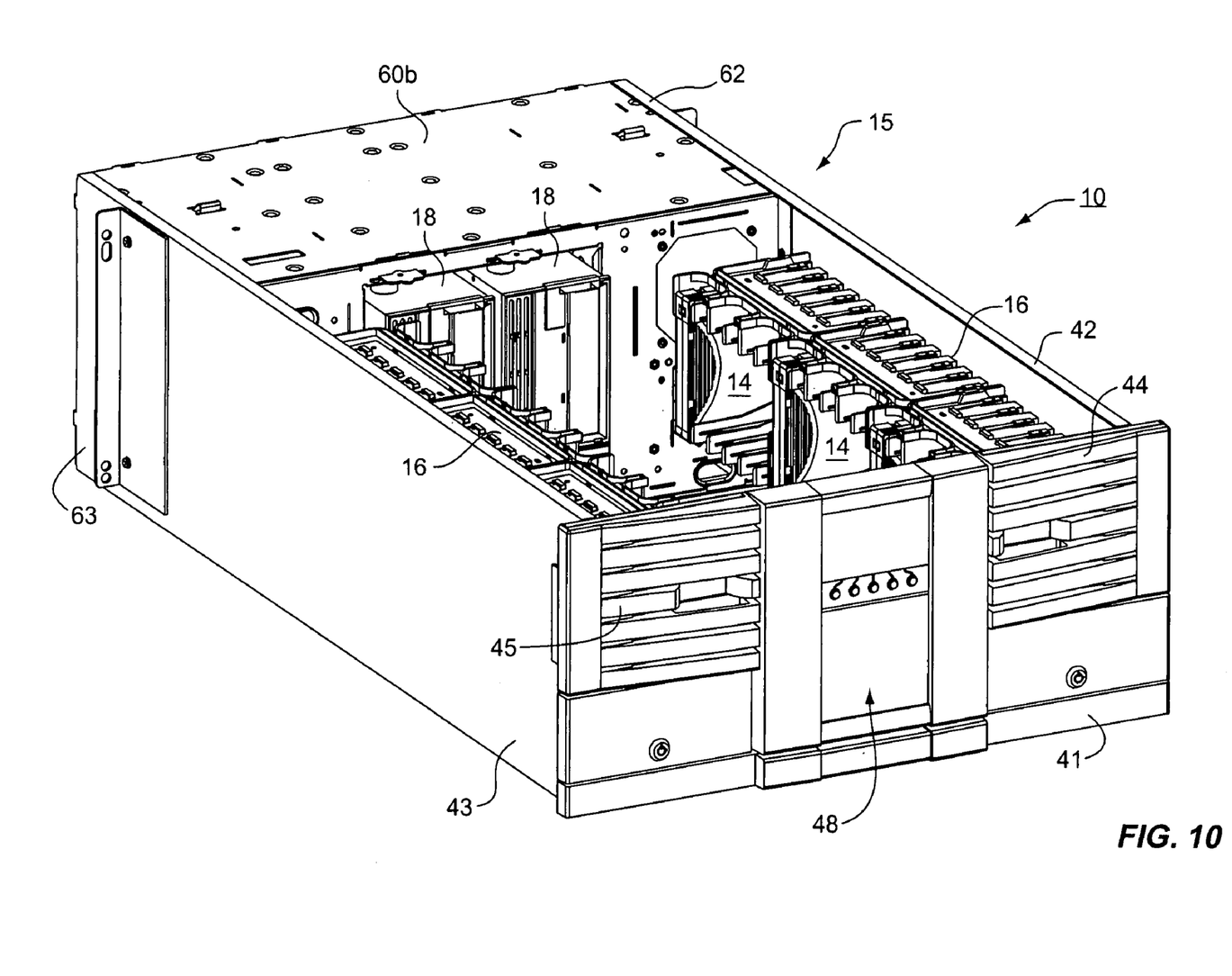
FIG. 10 is an isometric view of an alternative single plane apparatus like those in FIGS. 8 and 9.

Referring now to FIGS. 8–11, an exemplary apparatus 15 of an exemplary system 10 is shown which includes an open-backed housing 11 with at least a front wall 41, and right and left side walls 42, 43 which define an open rear area 46 therebetween (see particularly FIG. 8). The apparatus 15 shown in FIGS. 8–11 includes the magazines 16, with one or more data cartridges 14 (three shown in FIGS. 8–10 and four shown in FIG. 11). The front wall 41 may also include magazine doors 44, 45 with associated magazine door locks, magazine door solenoids, magazine door sensing apparatus, and the like for the insertion and/or removal of magazines 16 in/from the housing 11. Other elements may also be included on/in the front wall 41 such as any front cosmetics and/or a front control panel 48 (if desired/required) and other optional components disposed therein and/or attached thereto. Top and bottom walls or plates may also be included particularly for the single plane apparatuses; however, in adapting such single plane apparatuses for stacking or rack mounting the tops and/or bottoms will be removable and removed to open the interior space therebetween to allow for pass-through communication of the robotics or other pick and place machinery for movement of cartridges from one plane to another.

As introduced, the rear area 46 of the apparatus 15 of FIGS. 8–11 is open. The opening 46 provides for receiving interchangeable modules hereafter generally designated with the reference numeral 60 with or without an alphabetical suffix (a, b, c, etc.). In at least one embodiment, the modules 60 may desirably have at least one common dimension as will be shown and described further below. A first such module 60 adapted to be disposed in the opening 46 is a base alignment panel 60a which can be disposed in the opening 46 and optionally attached to each of the side walls 42, 43 to strengthen the entire housing 11 and/or the overall structure or system 10 for shipment/transport purposes and/or to maintain the physical position of housing 11 for stacking and/or rack mounting. The width of the alignment module 60a fits the width of the opening defined by the walls 42, 43. Thus, for example, the alignment panel 60a can be used to hold the respective back ends 62, 63 of the respective side walls 42, 43 in alignment for mounting in a rack, such that the rack-mounting brackets or like features 64, 65 (see FIGS. 8 and 9) are properly aligned. Alternative structural features may be used for alternative rack styles and/or for securing two or more such apparatuses 15 in a stack (see e.g., stack 55 FIG. 4). When an apparatus 15 is completely attached to the rack column structure (see e.g., frame 50 of FIG. 3) or to the stack 55 (see e.g., FIG. 4), the base alignment panel 60a may be removed from the apparatus 15. The alignment of the apparatus 15 may now be secured or preserved by the rack/frame 50 or the stack 55.

Alternative discrete modules 60 can be interchangeably inserted into this open-backed area 46 of housing 11. Examples include a cartridge drive module 60b (with one or more cartridge drives 18; see FIG. 10) or a cartridge magazine module 60c (with one or more magazines 61; see FIG. 1). Each of the alternative discrete modules are functional insert units whether for example, holding the side walls in alignment (e.g., module 60a), or providing data cartridge read/write capability (e.g., data and/or tape cartridge drive module 60b), or providing cartridge storage (e.g., cartridge magazine module 60c). In each of the examples shown and described here, a shared dimension of width is found in each of modules 60a, 60b and 60c. In this way, each of the modules 60 fits the open-back space defined by the side walls 42, 43. Other dimensions may also be shared, as for example the relative heights, which are as shown here, all modules 60 being of the same heights as the side walls 42, 43. Such concepts may aid in other aspects of interconnection of the module(s) with the housing 11, as for example providing additional structural support and/or connection points for unshown top and/or bottom floor and/or ceiling members or plates. Further, one or more of the modules 60 may also share a third dimension, depth; however, as shown here, this added dimension may not be necessary. Module 60a is shown not as deep or thick as modules 60*b*, or 60*c*. However, these last two modules, modules 60*b*, or 60*c*, are shown having substantially the same depth which may provide an additional feature in that either may then present a substantially constant cartridge interface position for interface with the cartridge access device 12. Such shared configuration sizing may also be described as the modules having or presenting substantially the same spatial depth or volume.

Each of the modules 60 shown and described here is also optional, not being necessary in any one nor in all embodiments of the invention. There are optional additional module possibilities as well, as for example providing additional or alternative robotics or other pick and place mechanisms, inter alia.

These alternative modules 60 allow for configuring the overall system 10 to then meet specific customer desires and/or requirements (i.e., what are their application needs and/or desires). The configuration and re-configuration possibilities may then be flexible for one or more single plane apparatuses, as for example allowing for interchangeable modules 60*b* having differing numbers of drive devices built therein. Or, as with the stackable or rack mounted alternative architectures (see FIGS. 2–4), pluralities of simply modifiable base apparatuses 10 can be stacked vertically in a stack 55 or rack 50 making larger capacity overall systems 55/50. As an example where two (or more) discrete apparatuses 15 may be desired to be stacked or put together in a rack, it may be determined that only a single drive device 60*b* may be desired for the overall stack/rack 55/50 and thus a substitution of an enlarged capacity magazine module 60*c* may be desired to be inserted into one or more of the apparatuses 15 in the resultant stack/rack 55/50. Thus, an apparatus 15 as from FIG. 10 may be combined with an apparatus 15 as from FIG. 11 in a stack or a rack to form a system having larger cartridge storage capacity than priorly available. Note, this concept may provide for building cost effective solutions by adding more tape cartridges (e.g. storage locations) or tape drives.

Components (e.g., modules 60) of systems 10 (or 50) may be desirably interchanged for a number of reasons. Some examples of these reasons include not only the customer-specific configurations described above, but also system upgrades or requirements changes, component repair, maintenance, inter alia. More particularly, not only may the customer be able to configure the product system 10 and/or 50 to meet specific requirements/desires; e.g., selecting more drives or alternatively more tape cartridge storage locations; but also, the configuration can be modified, e.g., upgraded at a location of product usage (i.e., in the field), or otherwise, if the customer requirements change at a later date. Tape cartridges (or the magazines or drives associated therewith) may also change over time; for example, they may become less expensive, or they may become less complex and/or improve in product reliability. Then, a data management system 10 as described herein allows for interchanging modules 60 to take advantage of such changes, providing for replacing pre-existent one or more modules with the newer more improved modules 60. A system 10 such as this may thus be referred to as a modularized system 10, and a system such as this may also provide for less field installation time and/or may be less prone to field assembly error as compared to potential four sided systems/models (e.g., systems which having front, rear, left and right sides). Thus, systems and apparatuses whether of table-top units, stack and/or rack mounted, may provide for optimized configurability and/or installation and/or repair and/or maintenance.

It may be noted also that tape drives generally require a power supply, motherboard, and alignment means all of which add cost and complexity. Tape cartridges do not require external power or a motherboard which reduces cost. Separating these two different requirements into modules reduces cost for the customer and allows greater product flexibility. In either case, the power supply, mother board, controller board, fibre board, or the like, would be available in the tape drive module 60*b* (see FIG. 10), whereas though possible, the magazine module 60*c* which includes additional tape cartridge magazine storage locations, may, but need not include power supply, computing capacity and the like.

The drive module 60*b* and/or drive(s) 18 may be provided with various electromechanical sub-systems for reading and writing data from and/or to the media on/in the data cartridge(s) 14. In use, a system controller as for example a host computer 56 and/or a network connection 57 (FIG. 2), as from the control panel 48 on one or more of the base apparatuses 15 (see e.g., FIGS. 1 and 8–11), or the control panel 58 on the rack system 50 (see FIG. 2) may be used to input a command to retrieve a cartridge 14 in the system 10/50 to ultimately read and/or write data therefrom/thereto. The command will then cause the access device 12 to move to and retrieve the desired cartridge or otherwise have the particular cartridge moved thereto, and then move this cartridge to the tape drive unit 18 to read/write the data as desired. Then, after the desired operation has been completed, the access device can then access the cartridge from the tape drive and then move the cartridge or have the cartridge moved back to the appropriate magazine storage location. Such movements may be all single planar particularly in a single plane data storage/retrieval system or may involve movements in multiple planes, as for example retrieving a cartridge from a particular row of a particular magazine in a first plane, and then moving that cartridge to a second or any other plane for delivery to an appropriate tape drive.

In some alternative embodiments, the entire back side 46 may not necessarily be entirely open, but rather may have a pre-defined opening size between the back sides 62, 63 wherein the features hereof would remain to be the provision of a plurality of interchangeable modules 60 which would each of which fit within the pre-defined opening of whatever size between those back sides 62, 63 of housing 11. Thus, there may exist some semblance of a back wall; however, with an opening therein to accommodate the modules 60. There may further be structure/apparatus defined in and/or attached to the interior portion of the side walls adjacent or at the back sides 62, 63 thereof to accommodate the connection/attachment of the various modules 60 thereinto. The modules 60 would then be adapted to fit in the opening, generally by being of the same size, or substantially similarly-sized. In some embodiments, whether of a completely or only partially open-backed housing/system, such a concept may be referred to as a system providing a standard opening or a standardly-sized opening fitting each and/or all of the modules to be disposed therein, and in some of these embodiments, the standard opening may be of a single size, or "one size fits all"; and thus the modules may be of a standard size.

The foregoing description has been presented for purposes of illustration and description. It is not intended to be exhaustive or to limit the invention to the precise embodiments disclosed. Obvious modifications or variations are possible in light of the above teachings. The embodiment or embodiments discussed, however, were chosen and described to provide illustration of the exemplary principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

Accordingly, what is claimed is:

1. A data apparatus comprising:
   an open-backed housing having a front wall, and first and second side walls; and
   an open-backed portion defined between the first and second side walls,
   the open-backed portion being disposed to interchangeably receive any of a plurality of discrete, similarly-sized modules selected from the group consisting of an alignment panel module, a cartridge reader module, a cartridge writer module, a cartridge read/write module and a cartridge storage magazine.

2. An apparatus according to claim 1 further comprising top and bottom plates connected to the front and side walls.

3. An apparatus according to claim 1 further comprising top and bottom plates connected to the front and side walls, wherein the top and bottom plates are removable.

4. An apparatus according to claim 1 wherein the open-backed portion is selected from the group consisting of a fully open back portion and a partially open back portion.

5. An apparatus according to claim 1 wherein the plurality of discrete, similarly-sized modules are of a standard module size.

6. An apparatus according to claim 1 wherein the cartridge storage magazine is adapted to receive at least one data cartridge.

7. An apparatus according to claim 1 wherein the housing has at least one cartridge storage magazine door defined therein.

8. An apparatus according to claim 1 wherein the housing has a control panel defined therein.

9. An apparatus according to claim 1 further including a system controller selected from the group consisting of a host computer, a network connection and a control panel.

10. An apparatus according to claim 1 wherein the apparatus is an apparatus selected from the group consisting of a single plane apparatus and a multi-plane apparatus.

11. An apparatus according to claim 1 wherein the housing is adapted to be disposed in a system selected from the group consisting of a single plane system, a multi-plane system, a multi-plane stack system and a multi-plane rack mounted system.

12. A data apparatus comprising:
   an open-backed housing having a front wall, and first and second side walls; and
   an open-backed portion defined between the first and second side walls;
   whereby the open-backed portion is disposed to interchangeably receive any of a plurality of discrete, similarly sized modules therein; and
   wherein the housing has a device selected from the group consisting of a cartridge access device, a cartridge access robotic device, a cartridge access pick and place device, and a vertical lift assembly, disposed in operative relationship therein.

13. An apparatus according to claim 7 wherein the housing has at least one cartridge storage magazine door defined therein and, the at least one cartridge storage magazine door has at least one of the devices selected from the group consisting of an associated magazine door lock, magazine door solenoid, and magazine door sensing apparatus, connected in operable relationship therewith.

14. An apparatus according to claim 12 wherein the housing is adapted to be disposed in a multi-plane data storage system and has a cartridge access device disposed in operative relationship therein; whereby the cartridge access device is disposed to operate in all of the planes of the multi-plane data storage system.

15. A data system comprising:
   a housing comprising:
   a front wall, and
   first and second side walls; and
   a back portion defining an opening; and
   a plurality of separate modules, selected from the group consisting of an alignment panel module, a cartridge reader module, a cartridge writer module, a cartridge read/write module and a cartridge storage magazine and each of the plurality of separate modules fitting interchangeably within the opening of the back portion.

16. A system according to claim 15 wherein the opening of the back portion of the housing is coactive with each of the separate modules to receive any one of the plurality of separate modules therein.

17. A system according to claim 15 wherein each of the separate modules is separately coactive with the opening of the back portion of the housing to fit therewithin.

18. A system according to claim 15 wherein the opening of the back portion defines a standard opening size into which each of the plurality of separate modules are standardly-sized to be received.

19. A system according to claim 15 further including a system controller selected from the group consisting of a host computer, a network and a control panel.

20. A system according to claim 15, the system being defined having a capacity selected from the group consisting of a single plane and a multi-plane.

21. A data system comprising:
   a housing comprising:
   a front wall, and
   first and second side walls; and
   a back portion defining an opening; and
   a plurality of separate modules, whereby each of the plurality of separate modules fits interchangeably within the opening of the back portion; and
   wherein the housing is adapted to be alternatively disposed in any of a multi-plane stack system and a multi-plane rack mounted system.

22. A system according to claim 21 wherein the housing is adapted to be disposed in either of a multi-plane system and a multi-plane rack mounted system; and, whereby the system has a cartridge access device disposed in operative relationship therein; whereby the cartridge access device is disposed to operate in all of the planes of the multi-plane system.

23. A method for configuring a data system comprising:
   providing a data system comprising:
   a housing having a front wall, and first and second side walls; and a back area defined between the first and second side walls, the back area having an opening defined therein, the opening being disposed to interchangeably receive any of
   a plurality of discrete similarly-sized modules;
   selecting a discrete one of the similarly-sized modules from the group consisting of an alignment panel module, a cartridge reader module, a cartridge writer module, a cartridge read/write module and a cartridge storage magazine; and, inserting the selected one of the discrete modules into the opening.

24. A method according to claim 23 further comprising:
selecting a second discrete module; and,
interchangeably inserting the second module in the opening.

25. A method according to claim 23 wherein the data system is a first data system with a first housing and a first set of discrete similarly-sized modules; further comprising:
providing a second data system comprising:
a second housing having a respective front wall, and respective first and second side walls; and a respective second back area defined between the first and second side walls, the second back area having an opening defined therein; and
a second set of a plurality of discrete similarly-sized modules; whereby the opening in the back area of the housing is disposed to interchangeably receive any of the plurality of discrete similarly-sized modules therein; and building a multi-plane system in a system selected from the group consisting of a stack and a rack-mounted system, whereby the second data system is disposed above the first data system.

26. A method according to claim 25 wherein the selected module from the first set of modules is a first module; and further comprising:
selecting a discrete second module from the second set of a discrete similarly-sized modules, whereby the second module is different from the first module; and,
inserting the selected second module into the second opening.

* * * * *

UNITED STATES PATENT AND TRADEMARK OFFICE
CERTIFICATE OF CORRECTION

PATENT NO. : 7,061,767 B2 Page 1 of 1
APPLICATION NO. : 10/776704
DATED : June 13, 2006
INVENTOR(S) : Gregg S. Schmidtke et al.

Figure 11:
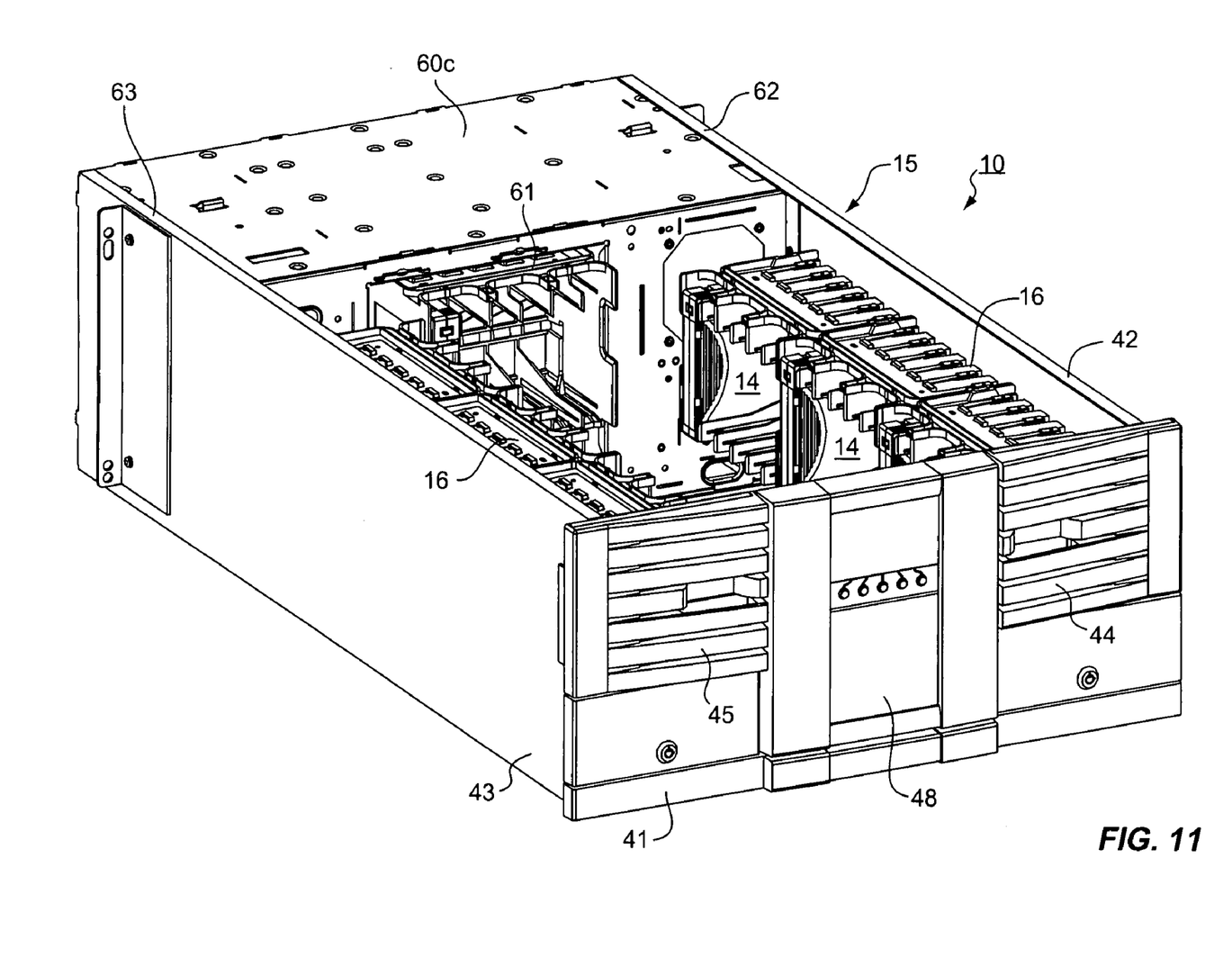
FIG. 11 is an isometric view of an alternative single plane apparatus like those in FIGS. 8, 9 and 10.

It is certified that error appears in the above-identified patent and that said Letters Patent is hereby corrected as shown below:

In column 4, line 48, delete "FIG. 1" and insert -- FIG. 11 --, therefor.

In column 7, lines 58-59, in Claim 12, delete "similarly sized" and insert -- similarly-sized --, therefor.

In column 7, line 65, in Claim 13, delete "claim 7" and insert -- claim 12 --, therefor.

Signed and Sealed this

Twenty-eighth Day of April, 2009

JOHN DOLL
*Acting Director of the United States Patent and Trademark Office*